United States Patent [19]

Fazan et al.

[11] Patent Number: 5,234,858
[45] Date of Patent: * Aug. 10, 1993

[54] STACKED SURROUNDING WALL CAPACITOR

[75] Inventors: Pierre C. Fazan; Howard E. Rhodes; Charles H. Dennison; Yauh-Ching Liu, all of Boise, Id.

[73] Assignee: Micron Technology, Inc., Boise, Id.

[*] Notice: The portion of the term of this patent subsequent to Mar. 31, 2009 has been disclaimed.

[21] Appl. No.: 614,770

[22] Filed: Nov. 16, 1990

[51] Int. Cl.⁵ .................. H01L 21/70; H01L 27/00
[52] U.S. Cl. ........................... 437/52; 437/47; 437/48; 437/60; 437/235; 437/919
[58] Field of Search .......... 437/47, 48, 52, 919, 437/60; 357/236; 365/185

[56] References Cited

U.S. PATENT DOCUMENTS 5,030,585 7/1991 Gonzalez et al. .............. 437/47
5,100,825 3/1992 Fazan et al. .................. 437/919

FOREIGN PATENT DOCUMENTS 2-226761 9/1990 Japan ........................ 437/52

OTHER PUBLICATIONS

"3-Dimensional Stacked Capacitor Cell for 16M and 64M DRAMS" IEDM, Dig. Tech., Papers, pp. 592-595, 1988 by T. Ema, S. Kawanago, T. Nishi, S. Yoshida, H. Nishibe, T. Yabu, Y. Kodama, T. Nakano and M. Taguchi.

"A Spread Stacked Capacitor (SCC) Cell for 64M Bit DRAMS" IEDM, Dig. Tech. Papers, pp. 31-34, 1989, by S. Inoue, K. Hieda, A. Hitayama, F. Horiguchi and F. Masuoka.

Primary Examiner—Olik Chaudhuri
Assistant Examiner—H. Jey Tsai
Attorney, Agent, or Firm—David J. Paul

[57] ABSTRACT

A stacked surrounding wall capacitor (SSWC) using a modified stacked capacitor storage cell fabrication process. The SSWC is made up of polysilicon structure, having an elongated v-shaped cross-section, located at a buried contact and extending to an adjacent storage node overlaid by polysilicon with a dielectric sandwiched in between. The addition of the polysilicon structure increases storage capability 50% without enlarging the surface area defined for a normal buried digit line stacked capacitor cell.

24 Claims, 7 Drawing Sheets

STACKED SURROUNDING WALL CAPACITOR

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3—DIMENSIONAL STACKED CAPACITOR CELL FOR 16M AND 64M DRAMS," IEDM, Dig. Tech. Papers, pp. 592–595, 1988, herein incorporated by reference, discusses a 3—dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31–34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked surrounding wall capacitor (SSWC) defined as a storage cell.

After a silicon wafer is prepared using conventional process steps, the present invention develops the SSWC by creating a v-shaped poly structure having elongated poly spacer walls conforming to the topology formed by three adjacent word lines running perpendicular to two adjacent digit lines, which results in increased capacitor plate surface area for each storage cell. Such a structure has the potential to increase the capacitance of a conventional STC cell by 50% or more, depending on the spacer wall height.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1-10.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
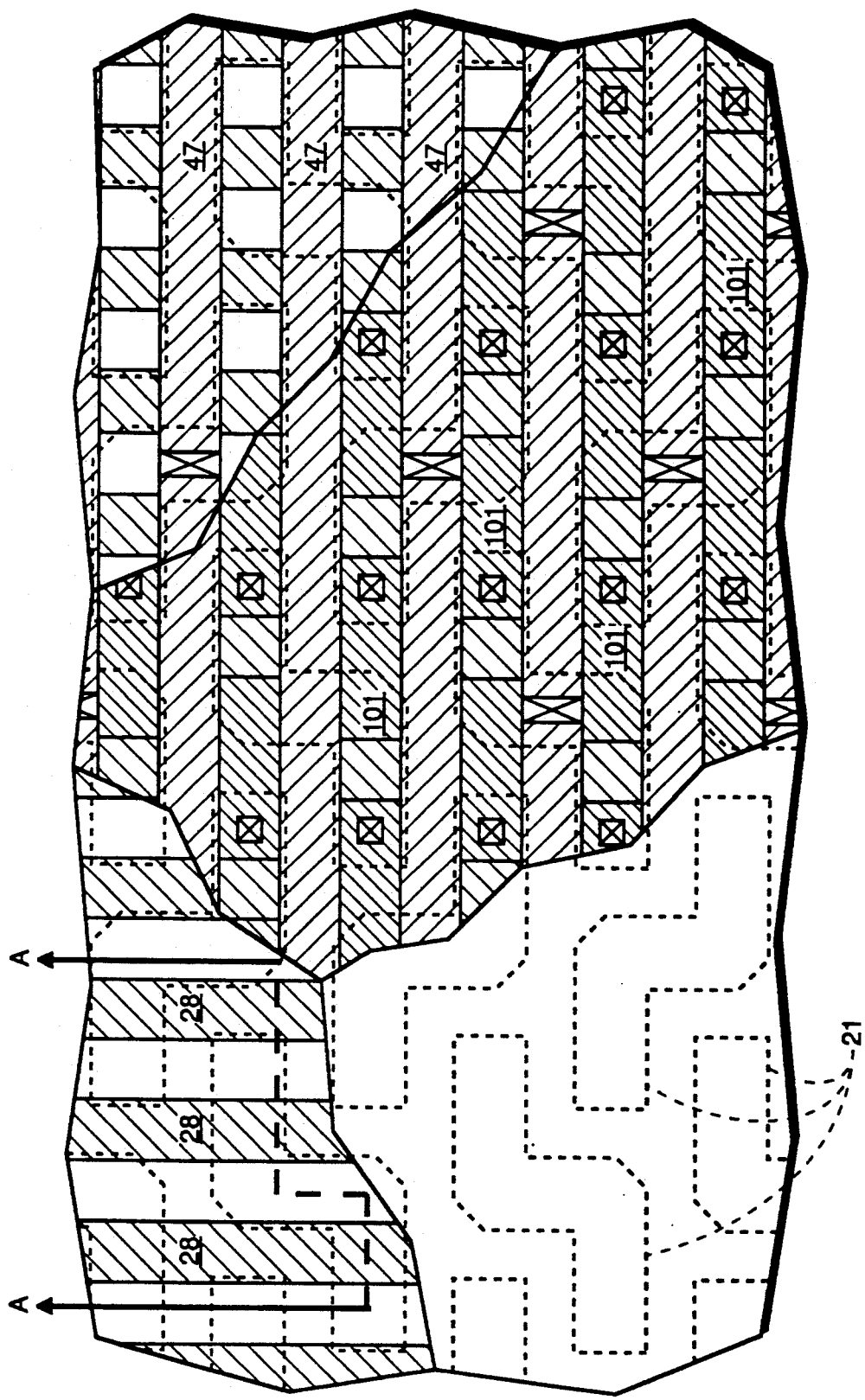
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines, word lines, active area, and an SSWC. The stacked capacitor structure of the preferred embodiment (the SSWC) is self-aligned to word lines as well as to digit lines.

Figure 2:
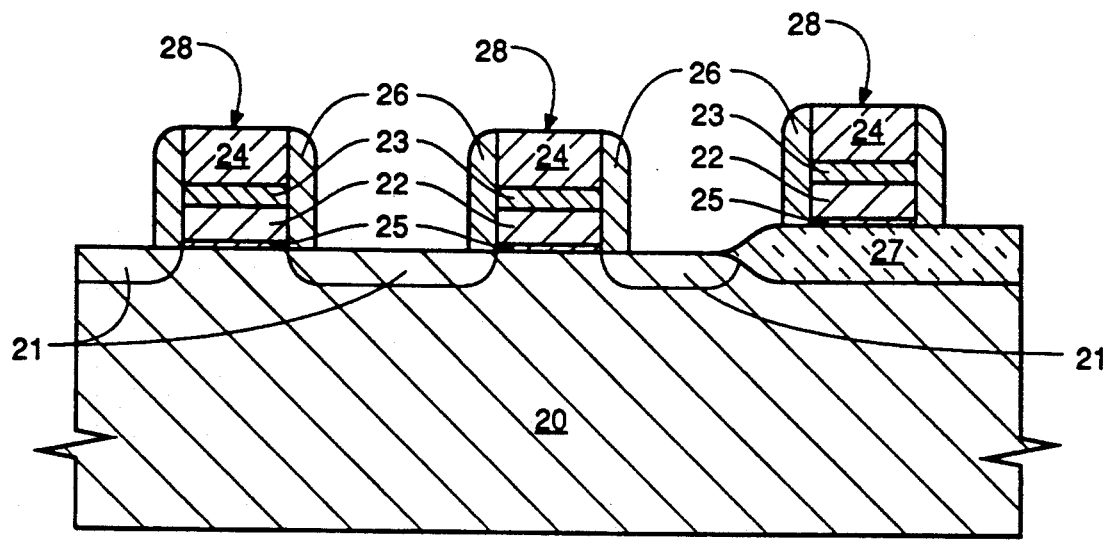
FIG. 2 is a cross-sectional view through broken line A—A of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 22.

Figure 3:
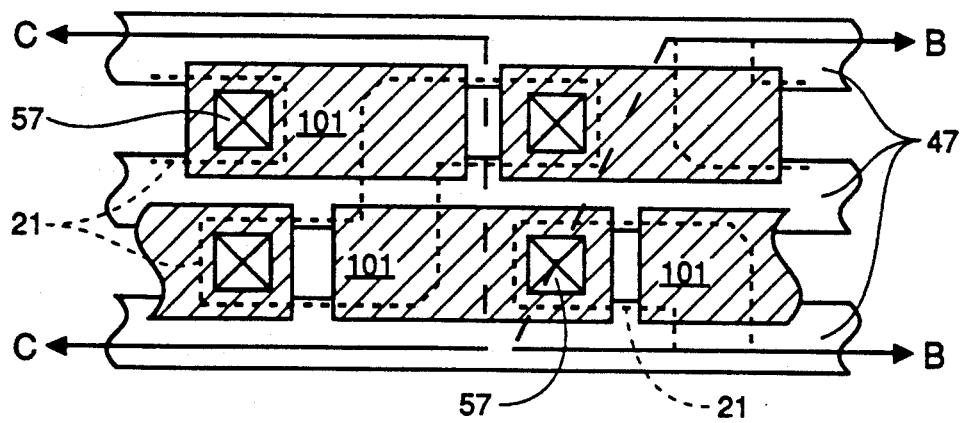
FIG. 3 is a top planar view of a portion of an in-process wafer showing digit lines, storage node contacts and storage capacitors.

FIG. 3 shows a top planar view of a portion of an in-process wafer showing digit lines, storage node contacts and storage capacitors.

Figure 4:
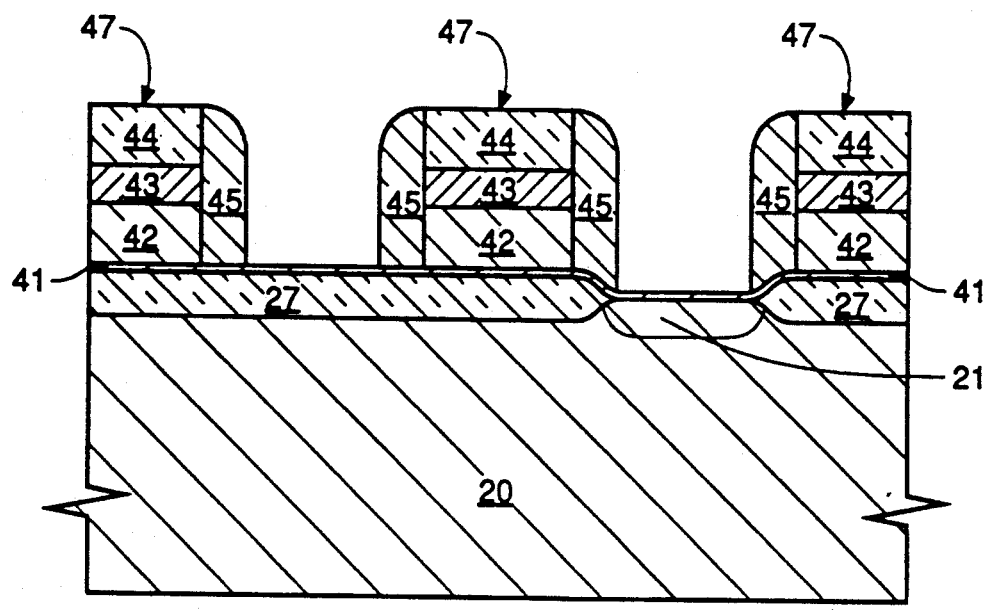
FIG. 4 is a cross-sectional view of the in-process wafer through broken line B—B of FIG. 3 following deposition and etching of digit line vertical dielectric spacers.

As shown in FIG. 4, an oxide layer 41 is deposited over the entire wafer array surface followed by buried digit line contacts patterning and etch. A blanket deposition of polysilicon 42, silicide 43 and dielectric 44, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 22 (shown in FIG. 2) and conform to the wafer surface resulting in a waveform-like topology running in both the digit line and word line directions. A second dielectric 45, such as nitride or oxide is now deposited, followed by an anisotropic etch to form vertical dielectric spacers 45.

Figure 5:
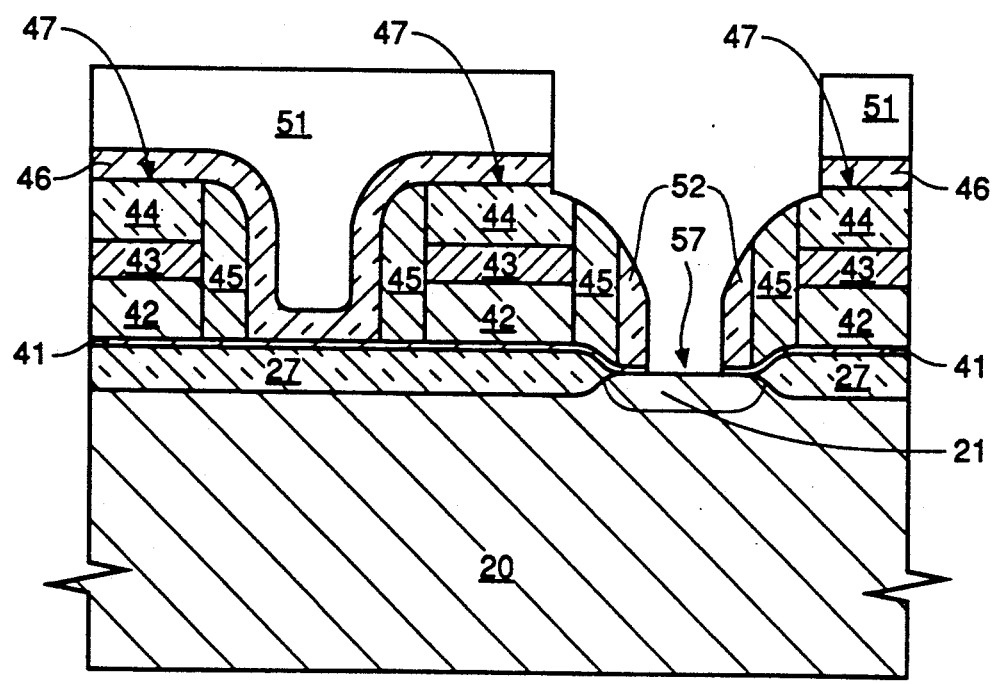
FIG. 5 is a cross-sectional view of the in-process wafer portion of FIG. 4 after conformal dielectric deposition, followed by a buried contact photo and etch.

As shown in FIG. 5, digit lines 42 and their subsequent isolation layers are then covered with a dielectric 46 that is also either oxide or nitride, to a preferred thickness of 500 to 2000 angstroms preferably by CVD. Subsequently, a buried contact 57, self-aligned to digit lines 42 by the presence of spacers 45, is located by covering all areas other than contact 57 location with photoresist 51. After applying an appropriate photomask, a buried contact anisotropic etch on the exposed dielectric creates additional spacers 52 and provides an opening to locate contact 57.

Up to this point, process flow has followed that of an array comprising conventional stacked capacitor cells. From this point forward, the process is unique to an array having SSWC-type storage capacitors.

Figure 6:
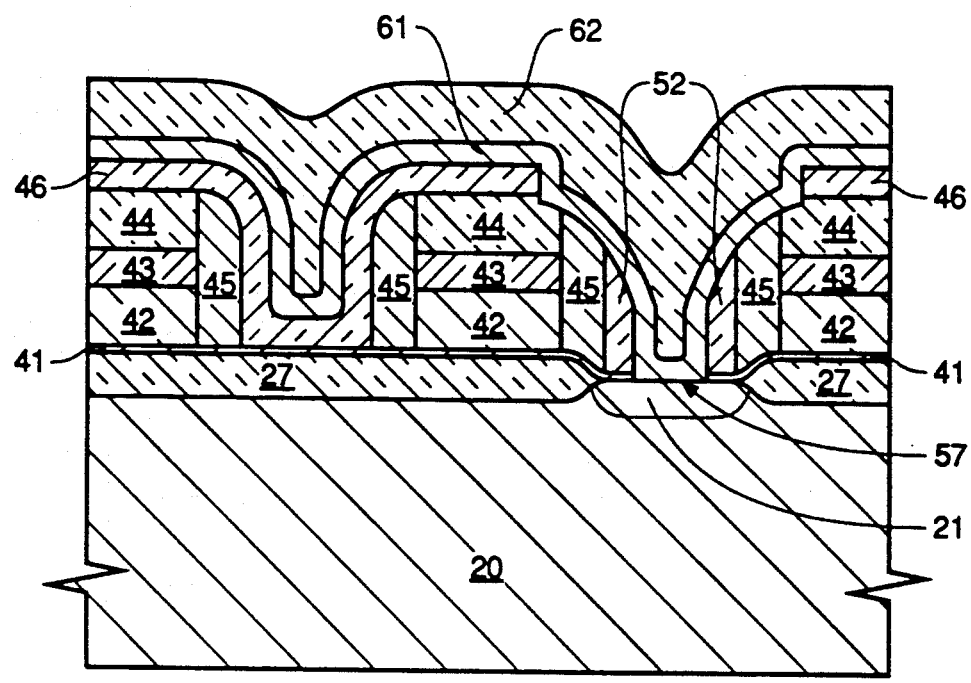
FIG. 6 is a cross-sectional view of the in-process wafer of portion of FIG. 5 following a photoresist strip, and a blanket deposition of conformal poly, poly doping and a blanket deposition of nitride.

As shown in FIG. 6, the photoresist 51 (of FIG. 5) has been stripped and a conformal poly layer 61 is deposited, preferably by low temperature deposition, over the entire array surface and couples to active area 21 via buried contact 57. Using low temperature deposition causes poly layer 61 to have a rugged textured surface that potentially doubles the surface area of poly layer 61. Following poly 61 deposition a conformal layer of dielectric 62 (such as oxide or nitride) is deposited, preferably by CVD.

Figure 7:
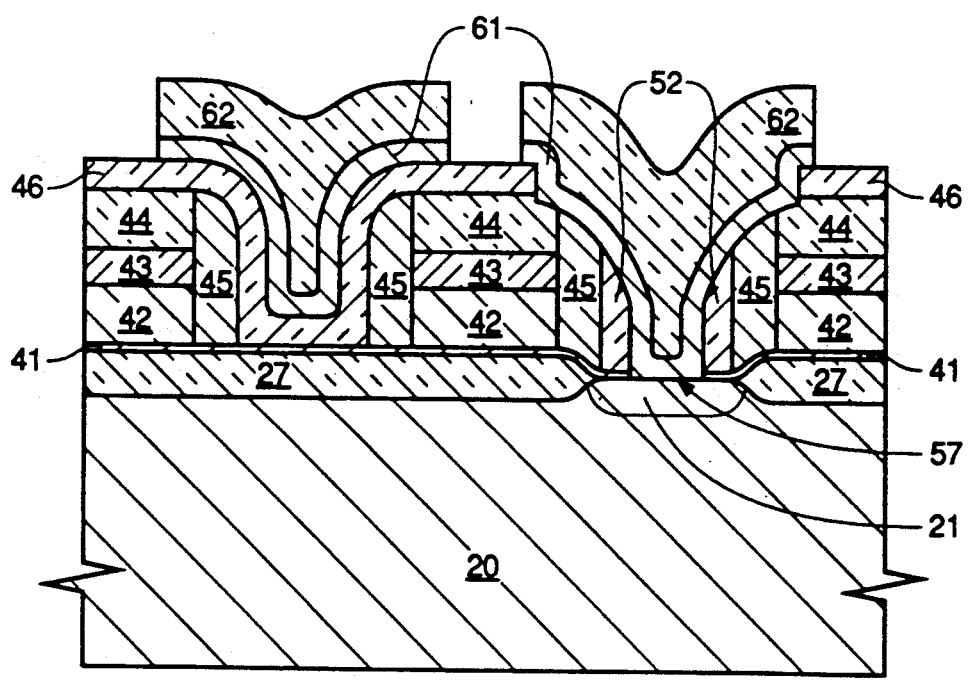
FIG. 7 is a cross-sectional view of the in-process wafer of portion of FIG. 6 following patterning of a poly storage node.

As shown in FIG. 7, poly layer 61 and oxide 62 are patterned to serve as a portion of a storage node plate of the SSWC storage capacitor. Poly plate 61 extends over an adjacent poly word line (the word line is not shown as it runs parallel to the cross-sectional view of FIG. 7) and continues to the next adjacent word line. Plate 61 conforms to the two perpendicular waveform-like topology (created after digit line formation) which run in both the word lines and the digit lines directions.

Figure 8A:
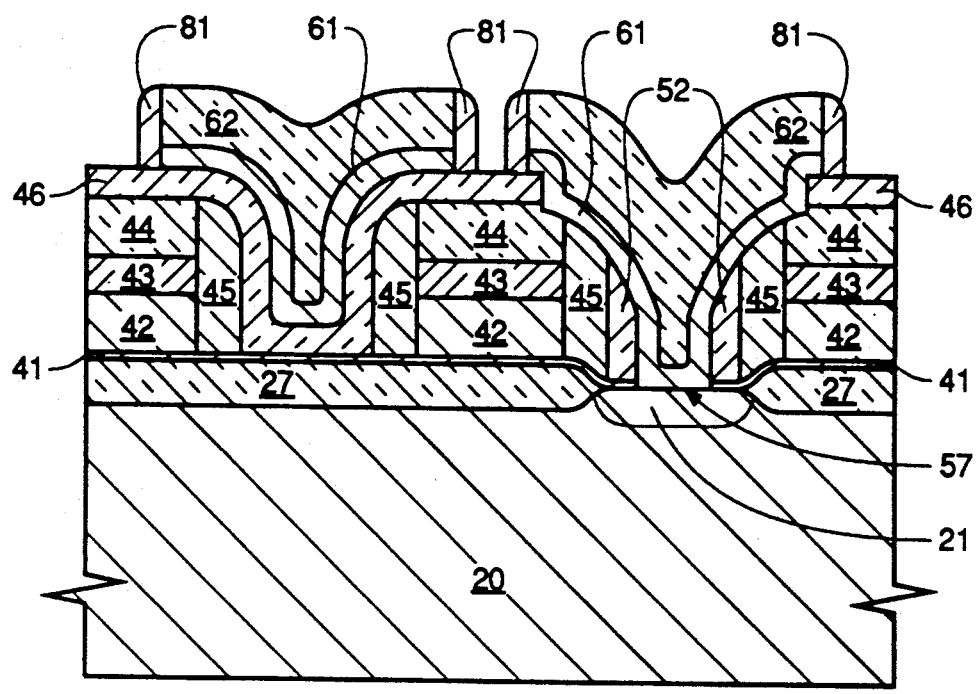
FIG. 8a is a cross-sectional view of the in-process wafer of portion of FIG. 7 after deposition and dry etching of conformal poly.
Figure 8B:
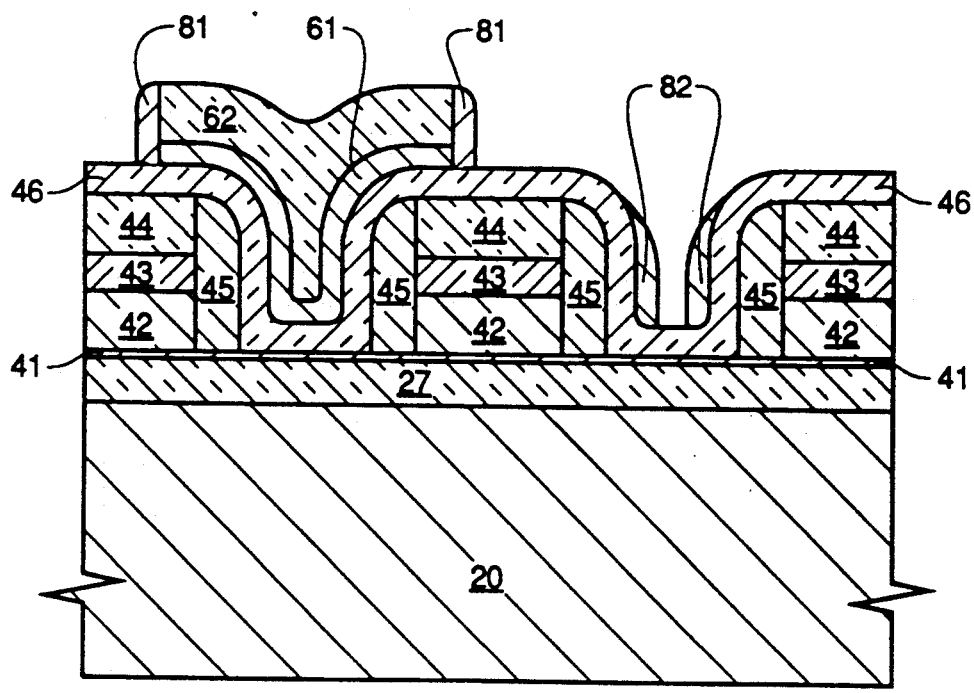
FIG. 8b shows the results of process steps performed at FIG. 8a, from a cross-section view taken through C—C of FIG. 3.

As shown in FIGS. 8a and 8b, a layer of poly is deposited that is then anisotropically etched using a dry poly etch to form poly spacer walls 81, of FIG. 8a and poly stringers 82, of FIG. 8b. Spacer walls 81 attach to poly 61 thus extending poly plate 61 in a substantially vertical direction. In addition, both sides of spacer walls 81 are available to gain capacitance. Following etching of poly 81, an extra photo step is required to remove stringers 82 in order to avoid adjacent storage nodes from shorting to another.

Figure 9A:
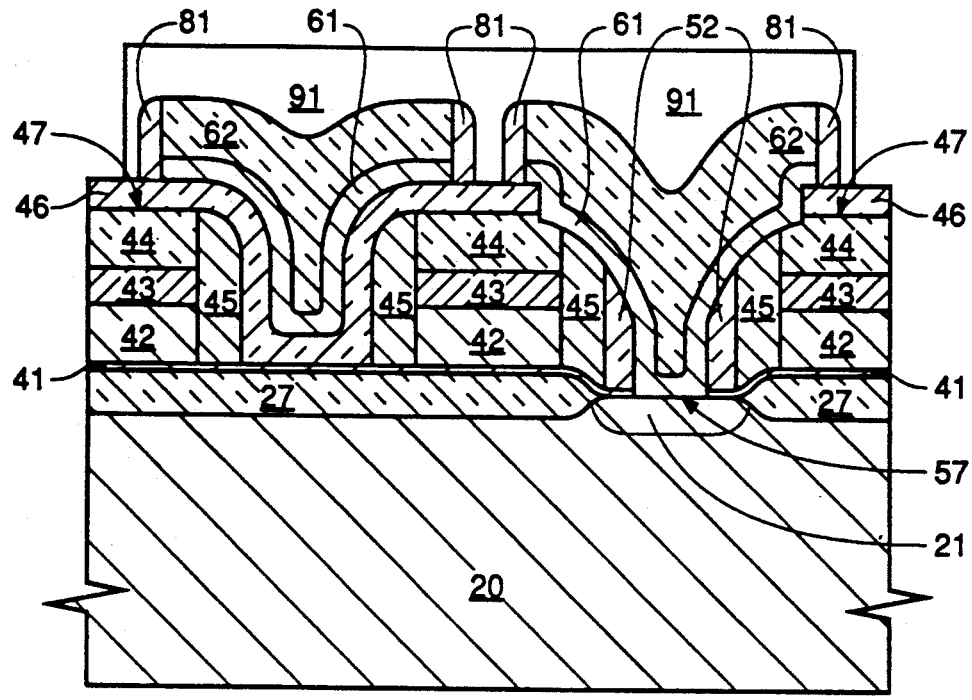
FIGS. 9a and 9b are cross-sectional views of the in-process wafer of portion of FIG. 8a and 8b following a storage node mask step.
Figure 9B:
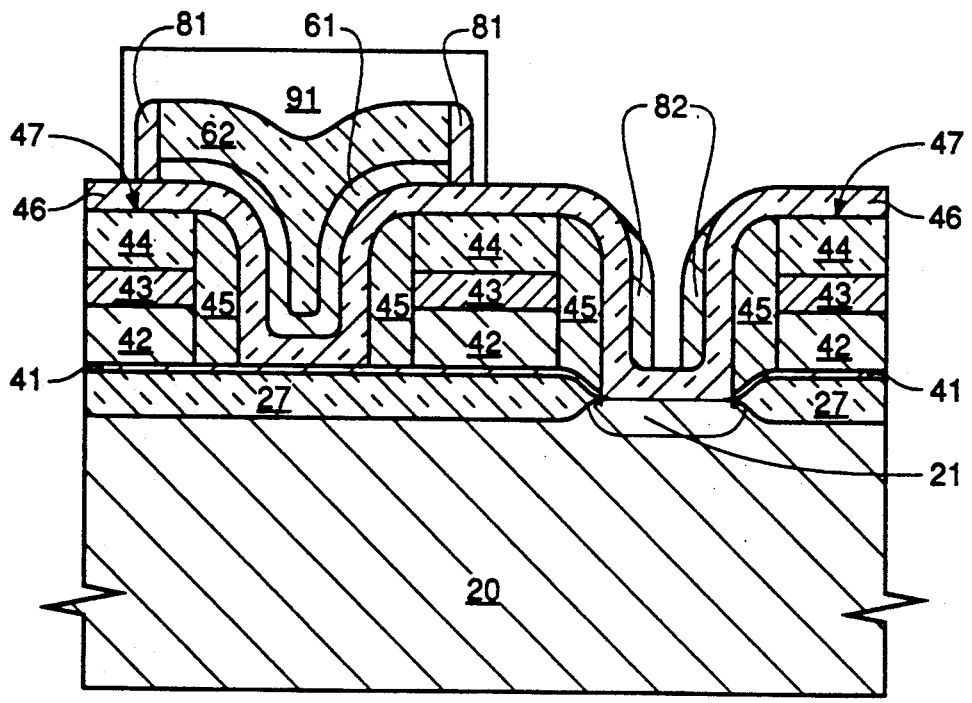

As shown in FIGS. 9a and 9b, photoresist 91 is deposited and patterned to protect the entire storage node area of FIG. 9a, while exposing stringers 82 outside the storage node area, as shown in FIG. 9b, to a dry poly etch. The dry poly etch completely removes all exposed stringers 82 outside the storage node areas. Poly spacer walls 81 combine with poly cell plate 61 to form an elongated v-shaped poly structure 101, of FIG. 10, to serve as a completed storage node plate for the SSWC cell.

Figure 10:
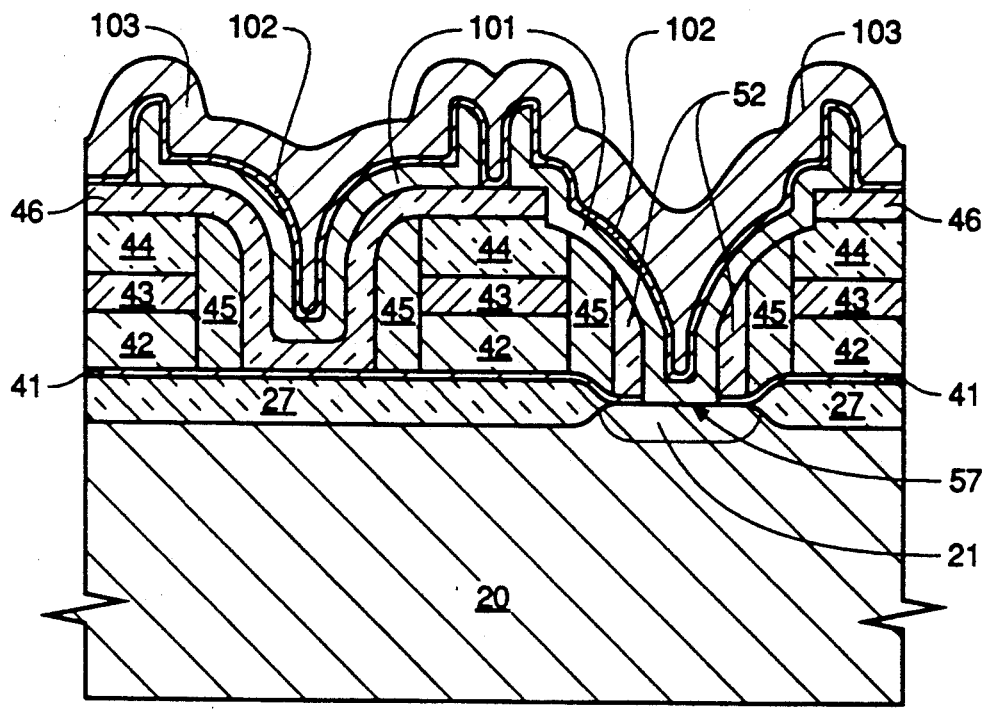
FIG. 10 is a cross-sectional view of the in-process wafer of portion of FIG. 9a following a dry poly stringer etch, a photoresist strip, a wet oxide etch, and blanket depositions of conformal nitride and poly.

As is also shown in FIG. 10, a dielectric layer of nitride 102 is deposited that conforms to poly structure 101. Nitride 102 serves as a capacitor dielectric for the SSWC cell. Following nitride 102 deposition, a blanket deposition of conformal poly 103 is deposited. Poly structure 101 and poly 103 are conductively doped either n-type or p-type depending on the conductivity type desired for active area 21. Poly 103 now serves as a top poly capacitor cell plate of the SSWC storage capacitor which also becomes a common cell plate to all SSWC storage capacitors in the array.

With the addition of poly plate 101 as the storage node plate along with top poly capacitor cell plate 103 that envelops plate 101, substantial capacitor plate surface area is gained at the storage node. Since capacitance is mainly effected by the surface area of a capacitor's cell plates the additional area gained by a 3-dimensional SVC structure can provide an additional 50% or more increase in capacitance over that of a conventional STC capacitor, without more space than that required for defining a stacked capacitor storage cell. In fact, the capacitance gained depends directly on the spacer wall height.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the steps of:
    creating a plurality of separately isolated active areas in DRAM array arranged in parallel interdigitated rows and parallel non-interdigitated columns;
    creating a gate dielectric layer on top of each active area;
    depositing a first electrically conductive layer superjacent surface of said array;
    depositing a first dielectric layer superjacent said first conductive layer;
    masking and etching said first conductive and said first dielectric layers to form a plurality of parallel conductive word lines aligned along said rows such that each said word line passes over an inner portion of each said active area being separated therefrom by a remanent of said gate dielectric layer;
    creating first and second conductively-doped regions within each said active area, said first and second regions being on opposite side of each said word line, said first region providing digit line junction and said second region providing storage node junction;
    depositing a second dielectric layer superjacent said array surface;
    creating a first aligned buried contact location at each said digit line junction in each said active area;
    depositing a second electrically conductive layer superjacent said array surface, said second conductive layer making direct contact to said digit line junction at said first buried contact locations;
    depositing a third dielectric layer superjacent to said second conductive layer;
    masking and etching said second conductive layer and said third dielectric layer to form a plurality of parallel conductive digit lines aligned along said columns such that a digit line makes electrical contact at each digit line junction within a column, said digit lines running perpendicular to end over said word lines forming a 3-dimensional, waveform-like topology;
    depositing a first oxide layer superjacent said array surface of said waveform-like topology;
    creating a second aligned buried contact location at each said storage node junction in each said active area;
    depositing a third electrically conductive layer superjacent said array surface making contact to said storage node junctions at said second buried contact locations, assuming said waveform-like topology in response to existing topology;
    depositing a fourth dielectric layer;
    patterning said third conductive layer and said fourth dielectric layer to form a portion of a storage node plate at each said storage node junction, said storage node plate having a v-shaped cross-section;
    depositing and patterning a fourth electrically conductive layer, said fourth conductive layer attaching to said third conductive layer thereby forming a completed storage node plate having an elongated v-shaped cross-section;
    masking said storage node plate with resist and etching away poly stringers present outside a storage node area;
    removing said resist;
    isotropically etching said fourth dielectric layer;
    depositing a cell dielectric layer adjacent and coextensive with said storage node plate and adjacent said array surface; and
    depositing a fifth electrically conductive layer adjacent to and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first, said second and said fourth dielectric layers are selected from the group consisting of oxide and nitride.

5. A process as recited in claim 1, wherein said third dielectric layer is oxide.

6. A process as recited in claim 1, wherein said first and said second buried contacts are self aligned.

7. A process as recited in claim 1, wherein said third, said fourth and said fifth conductive layers are doped polysilicon.

8. A process as recited in claim 7, wherein said third and said fourth conductive layers are deposited by low temperature deposition.

9. A process as recited in claim 1, wherein said second, said third, and said fourth dielectric layers are deposited by chemical vapor deposition.

10. A process as recited in claim 1, wherein said cell dielectric layer is nitride.

11. A process for fabricating a stacked capacitor on a silicon substrate in a semiconductor memory device, said process comprising the steps of:
    forming a first insulating layer superjacent the existing material fabricated on the surface of said silicon substrate;
    creating an aligned buried contact location through said first insulating layer thereby exposing an active area storage node junction residing in said silicon substrate;
    forming a first electrically conductive layer superjacent said first insulating layer, said first conductive layer making contact to said storage node junction via said buried contact location;

forming a second insulating layer overlying said first conductive layer;

patterning said first conductive layer and said second insulating layer to form a portion of a storage node plate at said storage node junction, said storage node plate having a v-shaped cross-section;

forming and patterning a second electrically conductive layer, said second conductive layer attaching to said first conductive layer thereby forming a completed storage node plate having an elongated v-shaped cross-section;

masking said storage node plate and removing any stringers present outside a storage node area;

removing said second insulating layer;

forming a cell dielectric layer adjacent and coextensive with said storage node plate; and forming a third electrically conductive layer adjacent to and coextensive with said cell dielectric layer to form a cell pate.

12. A process as recited in claim 11, wherein said first insulating layer comprises oxide.

13. A process as recited in claim 11, wherein said second insulating layer is selected from the group consisting of oxide and nitride.

14. A process as recited in claim 11, wherein said buried contact is self aligned.

15. A process as recited in claim 11, wherein said first, said second and said third conductive layers comprise doped polysilicon.

16. A process as recited in claim 15, wherein said first and said second polysilicon layers are deposited by low temperature deposition.

17. A process as recited in claim 11, wherein said forming of said first and second insulating layers comprises chemical vapor deposition.

18. A process as recited in claim 11, wherein said forming of said first, second, and third conductive layers comprises deposition.

19. A process as recited in claim 11, wherein said removing said second insulating layer comprises etching isotropically;

20. A process as recited in claim 11, wherein said cell dielectric layer comprises nitride.

21. A process for fabricating a stacked capacitor on a silicon substrate in a dynamic random access memory device, said process comprising the steps of:

depositing an oxide layer superjacent the existing material fabricated on the surface of said silicon substrate;

creating a self-aligned buried contact location through said oxide layer thereby exposing an active area storage node junction residing in said silicon substrate;

depositing a first conductively doped polysilicon layer superjacent said oxide layer, said first conductively doped polysilicon layer making contact to said storage node junction via said self-aligned buried contact location;

depositing an insulating layer overlying said first conductively doped polysilicon layer;

patterning said first conductively doped polysilicon layer and said insulating layer to form a portion of a storage node plate at said storage node junction, said storage node plate having a v-shaped cross-section;

forming and patterning a second conductively doped polysilicon layer, said second conductively doped polysilicon layer attaching to said first conductively doped polysilicon layer thereby forming a completed storage node plate having an elongated v-shaped cross-section;

masking said storage node plate and removing any polysilicon stringers present outside a storage node area;

isotropically etching said insulating layer;

depositing a nitride cell dielectric layer adjacent and coextensive with said storage node plate; and depositing a third conductively doped polysilicon layer adjacent to and coextensive with said nitride cell dielectric layer to form a cell plate.

22. A process as recited in claim 21, wherein said insulating layer is selected from the group consisting of oxide and nitride.

23. A process as recited in claim 21, wherein said first and said second polysilicon layers are deposited by low temperature deposition.

24. A process as recited in claim 21, wherein said depositing of said oxide layer and said insulating layer comprises chemical vapor deposition.

* * * * *